US010187065B2

(12) United States Patent
Kerman

(10) Patent No.: US 10,187,065 B2
(45) Date of Patent: Jan. 22, 2019

(54) FOUR SPIN COUPLERS FOR QUANTUM INFORMATION PROCESSING

(71) Applicant: Massachusetts Institute of Technology, Cambridge, MA (US)

(72) Inventor: Andrew J. Kerman, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/976,291

(22) Filed: May 10, 2018

(65) Prior Publication Data

US 2018/0309452 A1 Oct. 25, 2018

Related U.S. Application Data

(63) Continuation-in-part of application No. 15/354,275, filed on Nov. 17, 2016.

(60) Provisional application No. 62/256,191, filed on Nov. 17, 2015.

(51) Int. Cl.
| | |
|---|---|
| *H03K 3/38* | (2006.01) |
| *H03K 19/195* | (2006.01) |
| *G01R 33/035* | (2006.01) |
| *G06N 99/00* | (2010.01) |
| *H01L 39/02* | (2006.01) |

(52) U.S. Cl.
CPC ..... *H03K 19/1952* (2013.01); *G01R 33/0358* (2013.01); *G06N 99/002* (2013.01); *H01L 39/025* (2013.01)

(58) Field of Classification Search
CPC .......... H03K 17/92; H03K 3/38; B82Y 10/00; G06N 99/002; H01L 39/223

USPC .......................................................... 327/528
See application file for complete search history.

(56) References Cited

U.S. PATENT DOCUMENTS

| | | | | |
|---|---|---|---|---|
| 4,621,203 A | * | 11/1986 | Sweeny | .................. H01F 36/00 257/30 |
| 5,768,297 A | | 6/1998 | Shor | |
| 5,942,997 A | * | 8/1999 | Silver | ................... H03M 1/121 341/133 |
| 6,627,915 B1 | | 9/2003 | Ustinov et al. | |
| 6,734,699 B1 | | 5/2004 | Herr et al. | |
| 8,018,244 B2 | | 9/2011 | Berkley | |

(Continued)

FOREIGN PATENT DOCUMENTS

CN 103227800 A 7/2013

OTHER PUBLICATIONS

PCT International Preliminary Report on Patentability dated May 31, 2018 for International Application No. PCT/US2016/062456; 6 Pages.

(Continued)

*Primary Examiner* — Anh Q Tra
(74) *Attorney, Agent, or Firm* — Daly, Crowley, Mofford & Durkee, LLP

(57) ABSTRACT

Structures and techniques, using superconducting Josephson-junction based circuits, to directly engineer physical multiqubit (or "many-qubit") interactions in a non-perturbative manner. In one embodiment, a system for multiqubit interaction includes: a multispin coupler including a plurality of loops, each loop having a pair of Josephson junctions; and a plurality of qubits each inductively coupled to the multispin coupler.

15 Claims, 9 Drawing Sheets

(56) References Cited

U.S. PATENT DOCUMENTS

| | | | |
|---|---|---|---|
| 8,174,305 B2* | 5/2012 | Harris | G06N 99/002 |
| | | | 257/312 |
| 8,179,133 B1* | 5/2012 | Kornev | G01R 33/0354 |
| | | | 324/225 |
| 8,854,074 B2* | 10/2014 | Berkley | B82Y 10/00 |
| | | | 326/3 |
| 9,812,836 B1* | 11/2017 | Osborn | H01S 3/02 |
| 2004/0012407 A1 | 1/2004 | Amin et al. | |
| 2004/0095803 A1 | 5/2004 | Ustinov | |
| 2004/0135139 A1 | 7/2004 | Koval et al. | |
| 2005/0273306 A1 | 12/2005 | Hilton et al. | |
| 2006/0147154 A1 | 7/2006 | Thom et al. | |
| 2006/0225165 A1 | 10/2006 | Maassen van den Brink et al. | |
| 2007/0241747 A1 | 10/2007 | Morley et al. | |
| 2008/0274898 A1 | 11/2008 | Johnson et al. | |
| 2009/0182542 A9 | 7/2009 | Hilton et al. | |
| 2009/0321720 A1 | 12/2009 | Rose | |
| 2010/0194466 A1 | 8/2010 | Yorozu et al. | |
| 2011/0018612 A1 | 1/2011 | Harris | |
| 2011/0065586 A1 | 3/2011 | Maibaum et al. | |
| 2012/0071333 A1 | 3/2012 | Kauffman et al. | |
| 2014/0097405 A1 | 4/2014 | Bunyk | |
| 2015/0032994 A1 | 1/2015 | Chudak et al. | |
| 2015/0111754 A1 | 4/2015 | Harris et al. | |
| 2015/0310350 A1 | 10/2015 | Niskanen et al. | |
| 2016/0335560 A1 | 11/2016 | Mohseni et al. | |
| 2017/0140296 A1 | 5/2017 | Kerman | |
| 2017/0141286 A1 | 5/2017 | Kerman | |
| 2017/0177534 A1 | 6/2017 | Mohseni et al. | |
| 2018/0218279 A1 | 8/2018 | Lechner et al. | |

OTHER PUBLICATIONS

PCT International Preliminary Report on Patentability dated May 31, 2018 for International Application No. PCT/US2016/062461; 7 Pages.

Response to Office Action dated May 11, 2018 for U.S. Appl. No. 15/354,275, filed Jul. 12, 2018; 5 pages.

Office Action for U.S. Appl. No. 15/354,275 dated May 11, 2018; 16 pages.

Non-Final Office Action dated Sep. 13, 2018 for U.S. Appl. No. 15/354,286; 16 Pages.

Andrew J. Kerman et al., "IARPA Quantum Enhanced Optimization (QEO) Study;" Presented on Oct. 26, 2015 and Jan. 20, 2016 at the IARPA BAA QEO Proposer's Days Briefings; 33 Pages.

Andrew J. Kerman; QEO Overview; PowerPoint Presentation Presented on Jun. 28, 2015 at the QEO Satellite Meeting of the Fourth Conference in Adiabatic Quantum Computing (AQC 2015); 11 Pages.

Certificate and Request for Consideration Under the After Final Consideration Pilot Program 2.0, filed Apr. 23, 2018 for U.S. Appl. No. 15/354,286: 2 pages.

Courtland; "Google Aims for Quantum Computing Supremacy;" Spectrum.IEEE.Org; North America; Jun. 2017; 2 pages.

Filippov, et al.; "Tunable Transformer for Qubits Based on Flux States;" IEEE Transactions on Applied Superconductivity; vol. 13; No. 2; Jun. 2003; 4 pages.

Kerman et al., "High-Fidelity Quantum Operations on Superconducting Qubits in the Presence of Noise;" Physical Review Letters, PRL 101, 070501; 2001; Aug. 15, 2008; 4 Pages.

Office Action for U.S. Appl. No. 15/354,286 dated Aug. 3, 2017; 16 pages.

PCT International Search Report and Written Opinion dated Jan. 19, 2017 for International Application No. PCT/US2016/062461; 8 Pages.

PCT International Search Report and Written Opinion dated Jan. 31, 2017 for International Application No. PCT/US2016/062456; 10 Pages.

Response to Office Action dated Aug. 3, 2017 filed on Nov. 3, 2017 for U.S. Appl. No. 15/354,286; 11 pages.

Response to U.S. Final Office Action dated Feb. 9, 2018 for U.S. Appl. No. 15/354,286; Response filed on Apr. 23, 2018; 8 pages.

U.S. Final Office Action dated Feb. 9, 2018 for U.S. Appl. No. 15/354,286; 17 Pages.

Wendin et al., "Superconducting Quantum Circuits, Qubits and Computing" dated Feb. 2, 2008; Retrieved from the Internet https://arxiv.org/pdf/cond-mat/0508729.pdf; 60 pages.

U.S. Non-Final Office Action dated Sep. 24, 2018, for U.S. Appl. No. 15/354,275; 10 Pages.

* cited by examiner

FOUR SPIN COUPLERS FOR QUANTUM INFORMATION PROCESSING

CROSS REFERENCE TO RELATED APPLICATIONS

This application is a continuation-in-part of U.S. application Ser. No. 15/354,275, filed 2016 Nov. 17, which claims the benefit under 35 U.S.C. 119(e) of U.S. Provisional Application No. 62/256,191, filed 2015 Nov. 17. The entire contents of these applications are hereby incorporated herein by reference in their entireties.

STATEMENT REGARDING FEDERALLY SPONSORED RESEARCH

This invention was made with government support under Contract No. FA8702-15-D-0001 awarded by the U.S. Air Force. The Government has certain rights in the invention.

BACKGROUND

Multiqubit quantum entanglement is a central physical resource on which the non-classical computational power of quantum information technology is based. As a result of this, known quantum information processing methods with the potential to achieve substantial performance improvement over classical techniques are built on methods for producing and exploiting large-scale quantum entanglement. The two most well-known quantum-processing paradigms are: digital quantum computing, which is expected to provide exponential performance enhancement most notably for problems in cryptography (Shor's algorithm) and quantum simulation of chemical and biological molecules (quantum phase estimation and variational eigensolver algorithms); and quantum annealing, where engineered quantum fluctuations may provide qualitative enhancement in the heuristic sampling of classical optimization problems. Also important is the recently-developed adiabatic method for simulating quantum chemistry, which encodes the quantum state properties of electronic molecular structure into the stationary states of an engineered Hamiltonian.

In all of these quantum-processing paradigms, the machinery for construction and protection of large-scale quantum entanglement relies on pairwise physical interactions between qubits, the only type available in current physical hardware. Larger-scale entanglement is then built up by combining many of these pairwise interactions, either by applying them successively in time in a pulsed manner, or by engineering many static pairwise interactions simultaneously to approximate an effective higher-order interaction perturbatively.

SUMMARY

It is appreciated herein that multiqubit interactions have engineering potential for improving the performance and scalability of quantum information processing systems. For example, in the case of digital quantum computing using surface-code-based topological encoding for fault-tolerance, the fundamental interactions that are required involve four qubits. Realizing this with two-qubit interactions requires four individual two-qubit gates and introduces an entirely new class of error processes relative to the idealized case. Block encoding in these schemes, which promises even higher performance, requires even higher-order interactions (e.g., involving more than four qubits). For quantum annealing, the quantum sampling effectiveness of complex classical configuration spaces depends exponentially on the number of spins involved in the physical interactions. Restriction to two-spin interactions only (as in existing commercial quantum information processing systems) is therefore an important reason that no evidence for quantum-enhanced performance has yet been observed in these machines.

Described herein are structures and techniques, using superconducting Josephson-junction based circuits, to directly engineer physical multiqubit (or "many-qubit") interactions in a non-perturbative manner. The overall function of the multispin coupler is to realize a potential energy vs. input flux characteristic that is nonlinear in a specific manner, such that when the state-dependent flux outputs of a plurality of qubits are combined and fed to the coupler flux input, the resulting energy or current of the coupler can be engineered to depend only on the parity of the state of the plurality of qubits. In some embodiments requiring a four-qubit interaction, the required energy vs. flux characteristic is a quartic function, with two local minima and one local maximum, symmetric around zero input flux.

According to one aspect of the disclosure, a system for multiqubit interaction includes: a multispin coupler including a plurality of loops, each loop having a pair of Josephson junctions; and a plurality of qubits each inductively coupled to the multispin coupler. In some embodiments, each loop of the multispin coupler includes an inductive element coupled between the pair of Josephson junctions and an energy storage element arranged in parallel with a first one of the pair of Josephson junctions. In certain embodiments, the multispin coupler further includes a transformer inductively coupled to each of the plurality of qubits and to each loop of the multispin coupler. In many embodiments, each of the plurality qubits includes a first loop and a second loop, the first and second loop each including a pair of Josephson junctions, the first loop further including an inductive element coupled between the pair of Josephson junctions. In some embodiments, the plurality of qubits includes three or more qubits.

In particular embodiments, the multispin coupler can be configured to operate in either an energy mode or a current mode, wherein in energy mode a total potential energy within the multispin coupler is proportional to a parity operator over each of the plurality of qubits, wherein in current mode a total current circulating within the multispin coupler is proportional to the parity operator over each of the plurality of qubits. In many embodiments, the multispin coupler can be configured to operate in either an energy mode or a current mode by adjusting a magnetic flux through one or more of the loops of the multispin coupler.

According to another aspect of the disclosure, a system for multiqubit interaction includes: a first multispin coupler; a plurality of second multispin couplers each inductively coupled to the first multispin coupler, wherein the first multispin coupler and each of the plurality of second multispin couplers include a plurality of loops, each loop having a pair of Josephson junctions; and a plurality of qubits coupled to each of the second multispin couplers.

In some embodiments, each of the plurality of second multispin couplers is configured to operate in an energy mode whereby a total potential energy within each of the plurality of second multispin couplers is proportional to a parity operator over each of the plurality of qubits coupled thereto, wherein the first multispin coupler is configured to operate in a current mode whereby a total current circulating within the first multispin coupler is proportional to a parity operator over each of the plurality of qubits coupled to each of the plurality of second multispin couplers.

In various embodiments, each of the plurality of second multispin couplers is configured to operate in a current mode whereby a total current circulating within each of the plurality of second multispin couplers is proportional to a parity operator over each of the plurality of qubits coupled thereto, and wherein the first multispin coupler is configured to operate in an energy mode whereby the total potential energy within the first multispin coupler is proportional to a parity operator over each of the plurality of qubits coupled to each of the plurality of second multispin couplers.

Other embodiments include a circuit for coupling four flux qubits. The circuit includes a spin qubit, magnetically biased at substantially one half of the magnet flux quantum, and a flux transformer, magnetically unbiased and inductively coupled to the spin qubit. The flux transformer also is inductively coupled to the four flux qubits, so that a measurement of the energy of the system has one of two values depending on a parity of the four flux qubits.

In various embodiments the spin qubit comprises a radio frequency superconducting quantum interference device (RF SQUID). The flux transformer may include a first loop having a first Josephson junction. The flux transformer also may include a second loop having the first Josephson junction and a second Josephson junction, for tuning an energy response of the circuit. Some embodiments further include four tuning couplers, each tuning coupler inductively coupled to the flux transformer and to a respective one of the four flux qubits. Each tuning coupler may be tuned to have a given magnetic interaction with the flux transformer. Some embodiments further include a second spin qubit that is magnetically unbiased and inductively coupled to the flux transformer. The second spin qubit also may include an RF SQUID. In some embodiments, the circuit is considered to include the four flux qubits inductively coupled to the flux transformer.

Still other embodiments include a method of measuring a spin parity of four flux qubits. The method requires coupling each of the four flux qubits to a flux transformer, the flux transformer being inductively coupled to a spin qubit that is magnetically biased at substantially one half of the magnetic flux quantum. The method also requires operating the circuit in a current mode, wherein a current circulating within the spin qubit is proportional to a quantum parity operator. The method also requires measuring the spin parity by sensing a magnetic flux, of the spin qubit, that has one of two values.

In some embodiments, sensing a magnetic flux includes sensing an RF SQUID. Coupling may involve inductively coupling each of the four flux qubits to a respective tuning circuit and inductively coupling each such tuning circuit to the flux transformer. In this case, the method may include tuning each tuning circuit to have a given magnetic interaction with the flux transformer, and the given magnetic interaction may produce a quartic response in the coupling circuit. Some embodiments of the method include inductively coupling the flux transformer to a second spin qubit that is magnetically unbiased, in which case the method also may include sensing a magnetic flux of the second spin qubit.

BRIEF DESCRIPTION OF THE DRAWINGS

The foregoing features may be more fully understood from the following description of the drawings in which.

The drawings are not necessarily to scale, or inclusive of all elements of a system, emphasis instead generally being placed upon illustrating the concepts, structures, and techniques sought to be protected herein.

DETAILED DESCRIPTION

Figure 1:
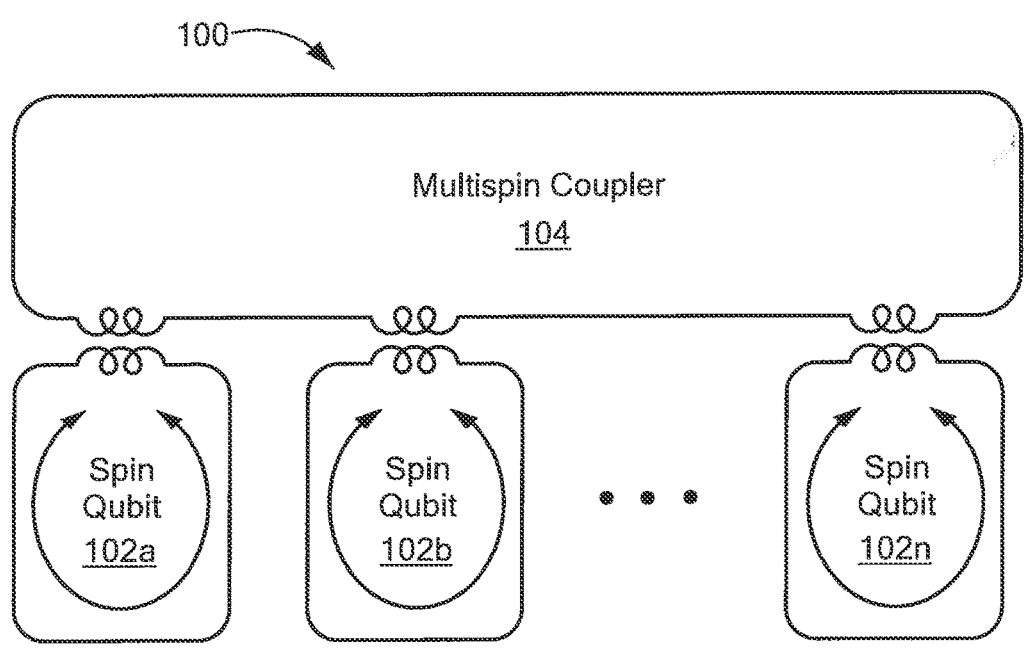
FIG. 1 is a block diagram of a system to provide multi-qubit interactions using a multispin coupler, according to an embodiment of the disclosure.

Referring to FIG. 1, according to an embodiment of the disclosure, a system 100 includes a plurality of qubits 102a-102n (generally denoted 102) and a multispin coupler 104.

In many embodiments, the qubits 102 are provided as flux qubits. As is known, flux qubits (also known as persistent current qubits) are micrometer-sized loops of superconducting metal interrupted by a number of Josephson junctions. The Josephson junction parameters may be fabricated such that a persistent current will flow continuously when an external flux is applied. The computational basis states of the qubit are defined by the circulating currents, which can flow either clockwise or counter-clockwise.

The multispin coupler 104 provides multiqubit (i.e., two or more) interactions in a non-perturbative manner. In some embodiments, the multispin coupler 104 may be provided as a multi-loop circuit.

Figure 2:
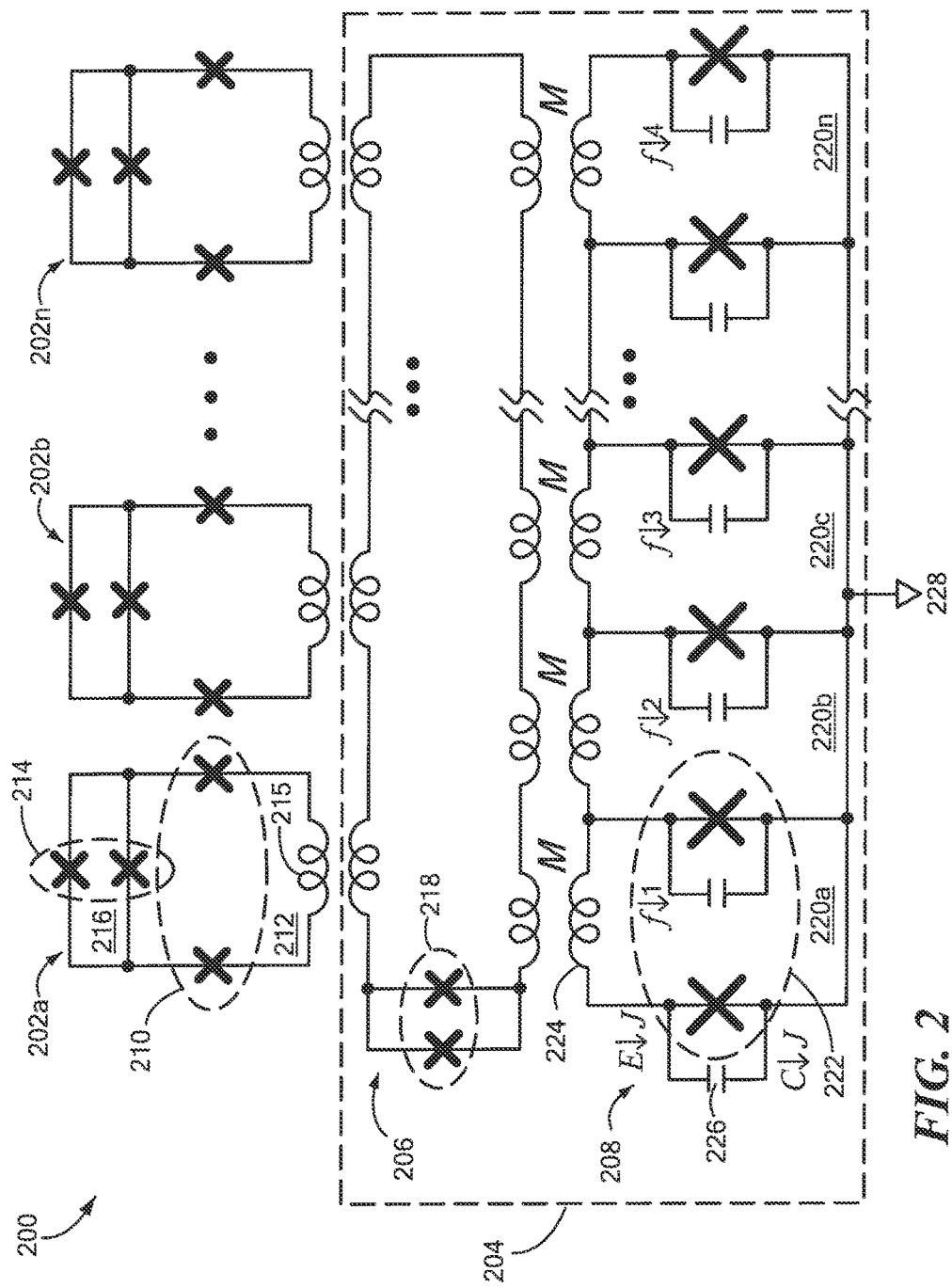
FIG. 2 is a diagram of a circuit to provide multiqubit interactions using a multiloop superconducting quantum interference device (mSQUID), according to another embodiment of the disclosure.

Referring to the embodiment of FIG. 2, a circuit 200 can provide multiqubit interactions using a multispin coupler. The circuit 200 includes a plurality of qubits 202a-202n (202 generally) and a multispin coupler 204 provided as a multiloop DC SQUID interferometer (referred to herein as an "mSQUID"). The mSQUID 204 includes a transformer 206 to which each of the qubits 202 may be inductively coupled.

In the embodiment of FIG. 2, the qubits 202 are provided as flux qubits each having two pairs of Josephson junctions (in FIG. 2, individual Josephson junctions are denoted "X"). For example, qubit 202a is denoted as having a first pair of Josephson junctions 210 arranged about a first loop 212, and a second pair of Josephson junctions 214 arranged about a second loop 216.

Each qubit 202 further includes an inductive element 215 to provide inductive coupling with the mSQUID transformer 206. As used herein, the term "inductive element" refers to any circuit element that stores energy in a magnetic field, including linear and nonlinear inductors, and functionally equivalent circuit elements that do not store energy in a magnetic field, such as Josephson junction-based nonlinear inductors. In the embodiment of FIG. 2, the qubit inductive element is coupled between the pair of Josephson junctions 210 within the first loop 212.

In other embodiments, the qubit inductive element 215 could be placed within the second loop 216 (e.g., between Josephson junctions 214). In certain embodiments, a qubit may include multiple indicative elements (e.g. one in each of its two loops). Those skilled in the art will understand that each loop of a qubit has a finite self-inductance to which other loops can couple via a mutual inductance. By coupling to a loop with the larger junctions (e.g., loop 212 in FIG. 2), this is effectively coupling to a Z operator, while the loop with the smaller junctions (e.g., loop 216 in FIG. 2) is effectively coupling to an X operator.

It should be understood that the concepts and structures sought to be protected herein are not limited to the qubit structure shown in FIG. 2. For example, in some embodiments, any qubit which has a state-dependent magnetic moment can be used.

The illustrative mSQUID 204 includes the transformer 206, a multiloop circuit 208 inductively coupled thereto, and an output 228. The transformer 206 may include a Josephson junction pair 218, as shown. Including Josephson junctions in the transformer can allow flux to enter and leave the transformer loop when it is cooling (so that flux is not trapped, as would happen in a closed superconducting loop). Josephson junction pair 218 may also allow the transformer 206 to be tunable.

The multiloop circuit 208 includes a plurality of loops 220a-220n (220 generally), each having a Josephson junction pair 222, an inductive element (e.g., a linear or non linear inductive element) 224 to provide inductive coupling to the transformer 206, and an energy storage element 226 (e.g., a capacitor) arranged in parallel with one of the loop Josephson junctions. To promote clarity in the figure, the Josephson junction pair, inductive element, and energy storage element are labeled only for a first loop 220a.

It should be understood that the number of loops 220 within the circuit 208 may be selected based on requirements for a given application. In particular, the number of loops 220 determines the number of free parameters that can be used to define the shape of mSQUID's nonlinear energy vs. flux characteristic. Thus, increasing the number of loops 200 may provide additional control required for a given application. However, it will be appreciated that increasing the number of loops 200 may require more flux from the transformer 206 for the mSQUID to function. It should also be understood that the number of loops 220 may be decreased to a single loop, as discussed below.

It will be appreciated that the design of each mSQUID loop 220 is based on that of a conventional DC SQUID, hence the name mSQUID (or multiloop SQUID). As is known, the effective Josephson potential energy of a DC SQUID can be modulated by changing the relative gauge-invariant phase between the two Josephson junctions, adjusted via the magnetic flux through the respective loop. In the case of a multiloop SQUID 204, an arbitrary potential energy function vs. uniform flux can be realized by adjusting the individual flux bias through the multispin coupler loops 220. In particular, the constant phase offset between each Josephson junction can be controlled to realize arbitrary potential energy function vs. uniform flux. The result is that for flux $\Phi$ coupled to a common transformer and applied equally to all loops 220 of the mSQUID 204, an arbitrary potential energy function $U(\Phi)$ can be engineered by appropriately tuning the offset fluxes applied to the individual loops 222.

In operation, each qubit 202 nominally produces a state-dependent flux $\pm\Phi_q$ through the transformer 206. For N qubits 202 coupled to transformer 206, the total qubit-state-dependent flux (i.e., the total state-dependent flux from all qubits, which is the input to the mSQUID) then takes one of the N+1 different values: $\Phi_k \in \Phi_q \{-N, -N+2 \ldots 0 \ldots N-2, N\}$.

It is appreciated herein the mSQUID 204 can be dynamically adjusted such that it behaves like a current source: $(\Phi)=I\Phi$, an inductor: $U(\Phi)=\Phi^2/2L$, or any more complicated nonlinear magnetic element whose behavior can be expressed as a potential energy $U(\Phi)$ (the classical parameters I, L, etc. are related to the Taylor expansion coefficients of the energy vs. flux characteristic about a chosen bias point). Furthermore, since the internal Josephson frequencies of the multispin coupler 204 can be kept relatively large (>100 GHz), this electrical behavior can be preserved over an extremely wide frequency range. As a result, the mSQUID 204 may be used in parametric nonlinear quantum devices—such as amplifiers and frequency converters—that conventionally rely on the "bare" Josephson nonlinearity, which is relatively weak by comparison.

Figure 3:
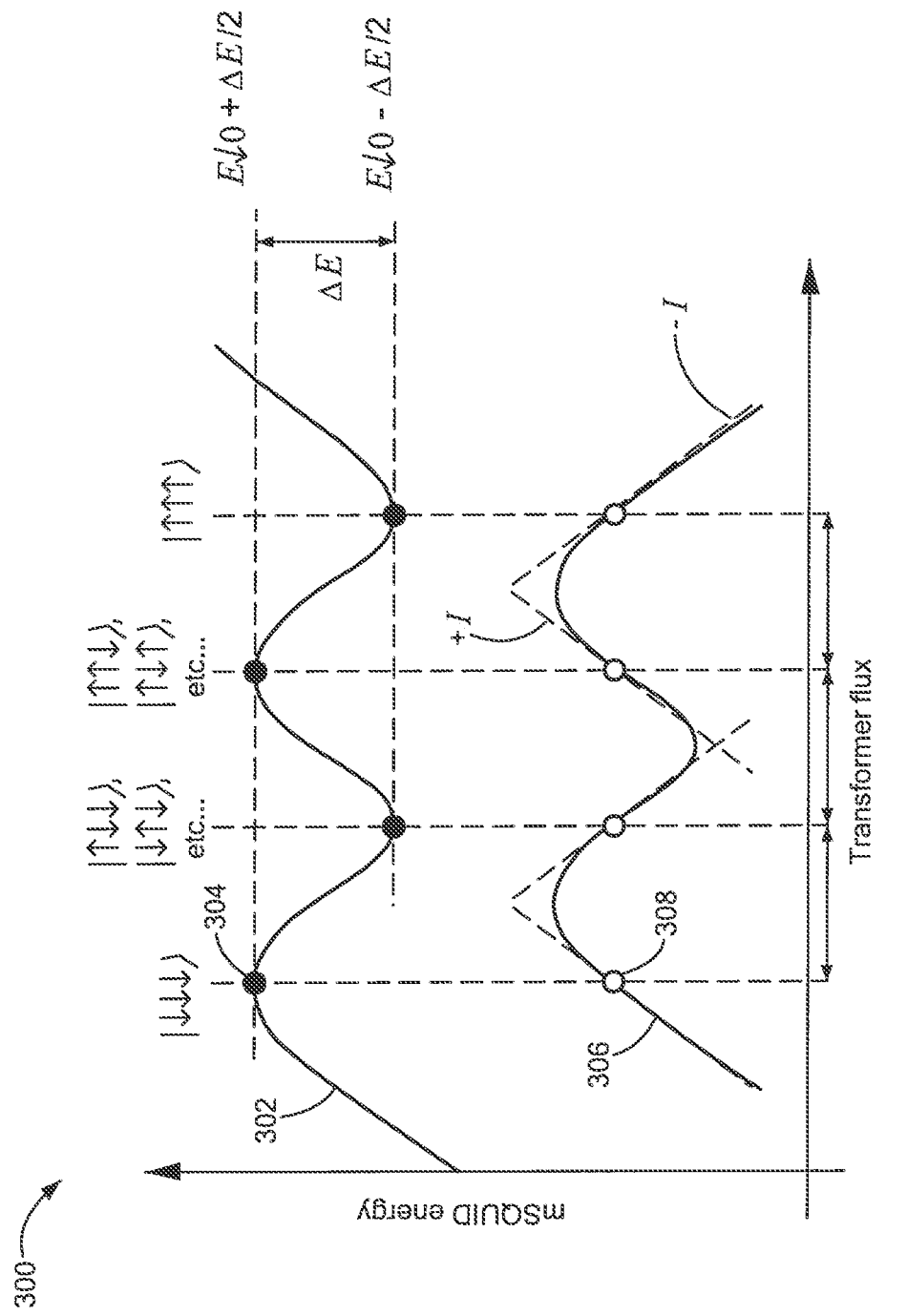
FIG. 3 is a graph illustrating different modes of mSQUID (and general multispin coupler) operation, according to embodiments of the disclosure.

Referring to FIG. 3, in various embodiments, an mSQUID (e.g., mSQUID 204 in FIG. 2) can be operated in two different modes: energy mode and current mode. In energy mode, the potential energy within the mSQUID's multiloop circuit is proportional to the N-qubit parity operator $\hat{P}_N \equiv \Pi_{i=1}^{N} \hat{\sigma}_i^z$ such that: $\hat{U}(\Phi_k)=\Delta E \cdot \hat{P}_N$, where $\hat{\sigma}_i^z$ is the Z operator for the ith qubit. In current mode, the total current circulating within the mSQUID's multiloop circuit is proportional to the N-qubit parity operator $\hat{P}_N \equiv \Pi_{i=1}^{N} \hat{\sigma}_i^z$ such that $\hat{I}(\Phi_k)=I_m \cdot \hat{P}_N$. In some embodiments, the mSQUID 204 can be configured to operate in a given mode by adjusting the magnetic flux through the mSQUID loops 220, as discussed above.

The graph 300 in FIG. 3 illustrates these two modes of mSQUID operation. The top curve 302 illustrates energy mode, wherein the total potential energy as a function of possible qubit flux values (denoted by circles along the curve 302, e.g., circle 304) is effectively proportional to a multispin (in this case, three-spin) operator: $\hat{U}=\Delta E \hat{\sigma}_1^z \hat{\sigma}_2^z \hat{\sigma}_3^z$. In energy mode, the potential energy vs. input flux can be tailored such that at the flux points accessible via the qubits' input to the transformer, the mSQUID energy takes on one of two values, according to the total parity of the qubit state. This results in an effective interaction between the qubits.

The bottom curve 306 illustrates the current mode of operation, in which the potential energy is the same at all of the possible qubit flux values (denoted by circles along the curve 306, e.g., circle 308), but the mSQUID circulating current (proportional to the slope of the energy vs. flux) is proportional to a multiquibit operator: $\hat{I}=I\hat{\sigma}_1^z \hat{\sigma}_2^z \hat{\sigma}_3^z$. In current mode, the potential energy is kept constant and independent of the qubits' input state, while the effective mSQUID circulating current (which is given by the derivative of the energy with respect to the flux) assumes only two values and is proportional to the total qubit state parity.

It should be understood that although FIG. 3 illustrates mSQUID operation for the case of three (3) qubits, the concepts, structures, and techniques sought to be protected herein be used to effect interactions between arbitrary numbers of qubits (e.g., between N qubits, where N>1).

Figure 2A:
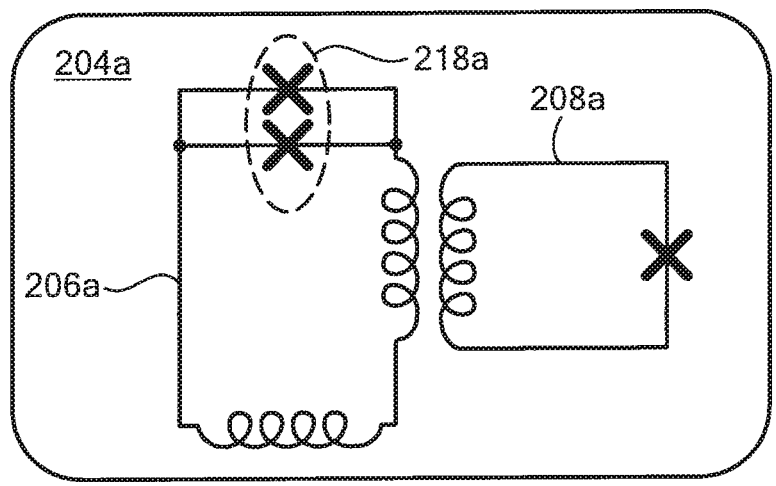
FIGS. 2A and 2B are diagrams of four-spin coupler circuits based on superconducting quantum interference devices (SQUIDs), according to other embodiments of the disclosure.

Various embodiments of multispin couplers for use in specific applications are now described in accordance with the concepts herein. It should be appreciated that these embodiments also may be operated in both the energy mode and the current mode described above. Referring to FIG. 2A, a multispin coupler 204a is shown for coupling four flux qubits. This capability could be used, for example, to directly realize the four-qubit operators upon which the surface-code quantum error correction scheme is based; or, it could be used to couple encoded qubits whose logical operators are weight-2 (i.e. consist of a two-qubit operator). Such distance-2 logical qubits would occur, for example, in the context of quantum error suppression. Six-qubit operators, realized using a sub-circuit of that shown in FIG. 4, could be used to directly realize interactions between two fault-tolerant logical qubits of distance 3, each having three-qubit logical operators.

Figure 3A:
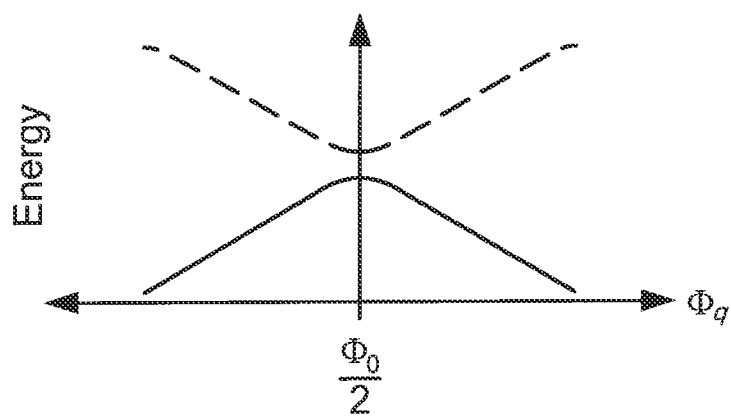
FIG. 3A illustrates the principle and mode of operation of the four-spin coupler embodiments of FIG. 2A and FIG. 2B.
Figure 3A:
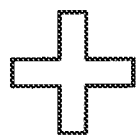
Figure 3A:
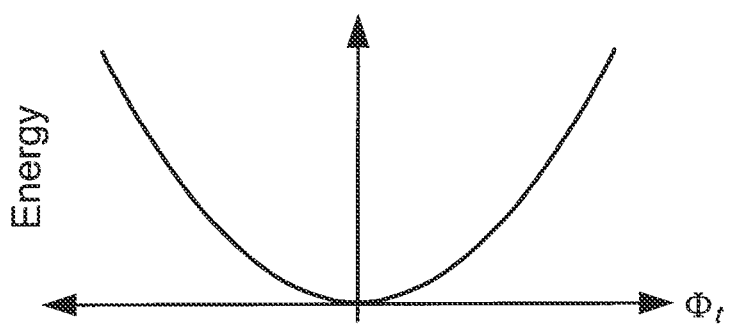
Figure 3B:
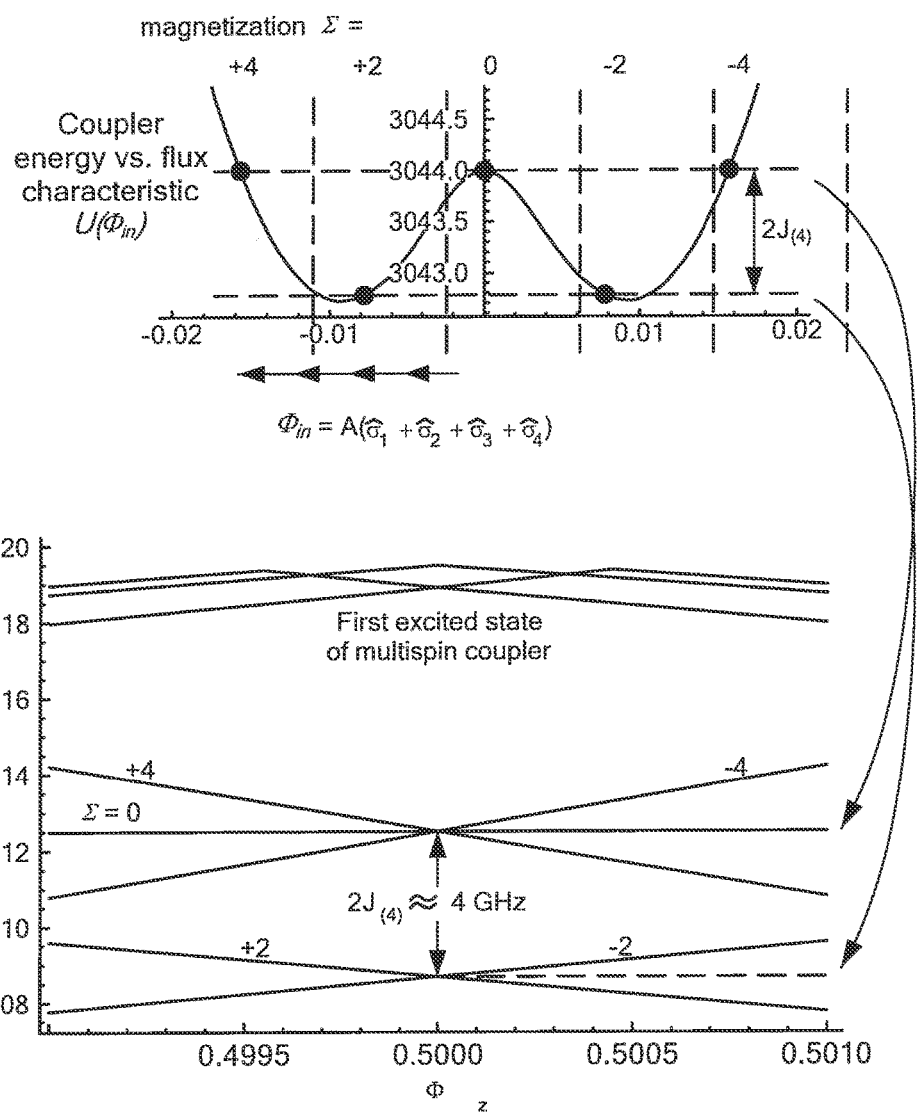
FIG. 3B shows a full simulation of the quantum energy levels for the resulting circuit shown in FIG. 2C.

The multispin coupler 204a may be used as the multispin coupler 104 of FIG. 1 or 204 of FIG. 2 and may spin-couple the qubits 102 or 202. The multispin coupler 204a is like, but simpler than, the mSQUID 208: the multiloop circuit 204 has been replaced by a single RF SQUID (i.e., a spin qubit) 208a. In the embodiment of FIG. 2A, the spin qubit 208a is magnetically biased substantially at its degeneracy point, i.e. one half of the magnetic flux quantum ($\Phi_0$=h/(2e). As shown in FIG. 3A, such a spin qubit 208a has strictly non-classical response as approximately negatively proportional to the absolute magnitude of the input flux relative to the symmetry point at a bias of ($\Phi_0/2$, while the transformer 206a has approximately a positive quadratic response. Adding these responses and tuning using the loop having the Josephson junction pair 218a, as indicated in FIG. 3B, produces a quartic energy versus flux response that can be adjusted so that it assumes one of two values depending on the total qubit state parity for the four flux qubits, as discussed above.

Figure 2B:
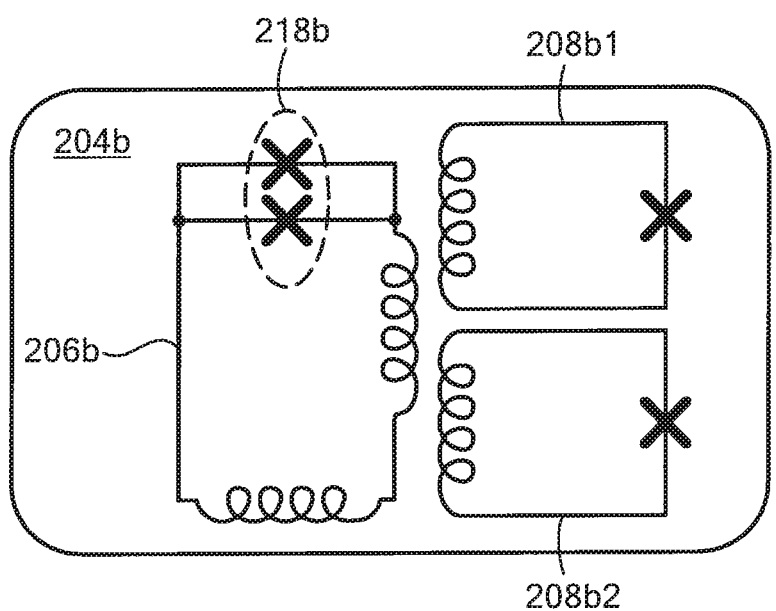

FIG. 2B shows an alternate embodiment of a multispin coupler 204b having a transformer 206b with a Josephson junction pair 218b, a biased spin qubit 208b1, and an unbiased RF SQUID 208b2. In the alternate embodiment of FIG. 2B, the unbiased RF SQUID 208b2 alters the energy response of the multispin coupler 204b and provides an additional degree of freedom for dynamic adjustment of the coupler.

Figure 2C:
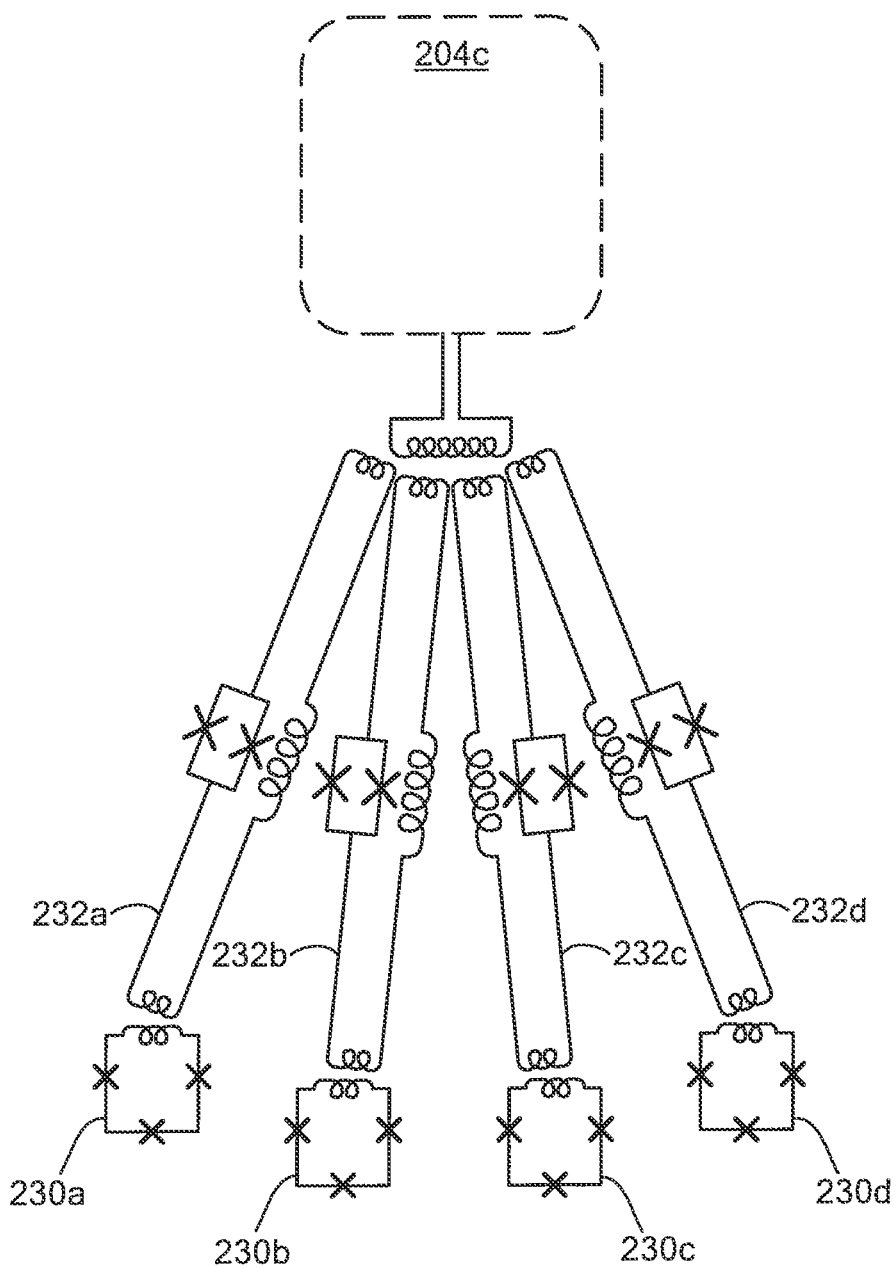
FIG. 2C is a diagram of a circuit to implement tunable quantum spin interactions between four qubits using a SQUID-based four-spin coupler, according to another embodiment of the disclosure.

Referring now to FIG. 2C, a multispin coupler 204c is coupled to four qubits 230a, 230b, 230c, 230d (collectively, qubits 230) using respective tuning couplers 232a, 232b, 232c, 232d (collectively tuning couplers 232). The multispin coupler 204c may be any multispin coupler described herein, including multispin coupler 104, 204, 204a, or 204b. The qubits 230 may be any qubits coupled as described herein, such as qubits 102 or 202. When coupling qubits 230 as just described, it is important that the multispin coupler 204c receives from each qubit 230 a qubit-state-dependent input flux of the correct magnitude. Therefore, some embodiments include tuning couplers 232 for matching these input fluxes from the qubits, which may also include some amplification of the qubit fluxes. The tuning couplers 232 may be independently tuned by applying a tuning magnetic field, using techniques known in the art.

FIG. 2C is only illustrative of the use of tuning couplers 232 with a multispin coupler 204c. While only four qubits 230 and four respective tuning couplers 232 are shown in FIG. 2C, tuning couplers may be used in this way for any greater or smaller number of qubits. Any suitable circuit for performing this flux matching may be used as a tuning coupler other than the circuits having the components indicated in FIG. 2C.

Figure 4:
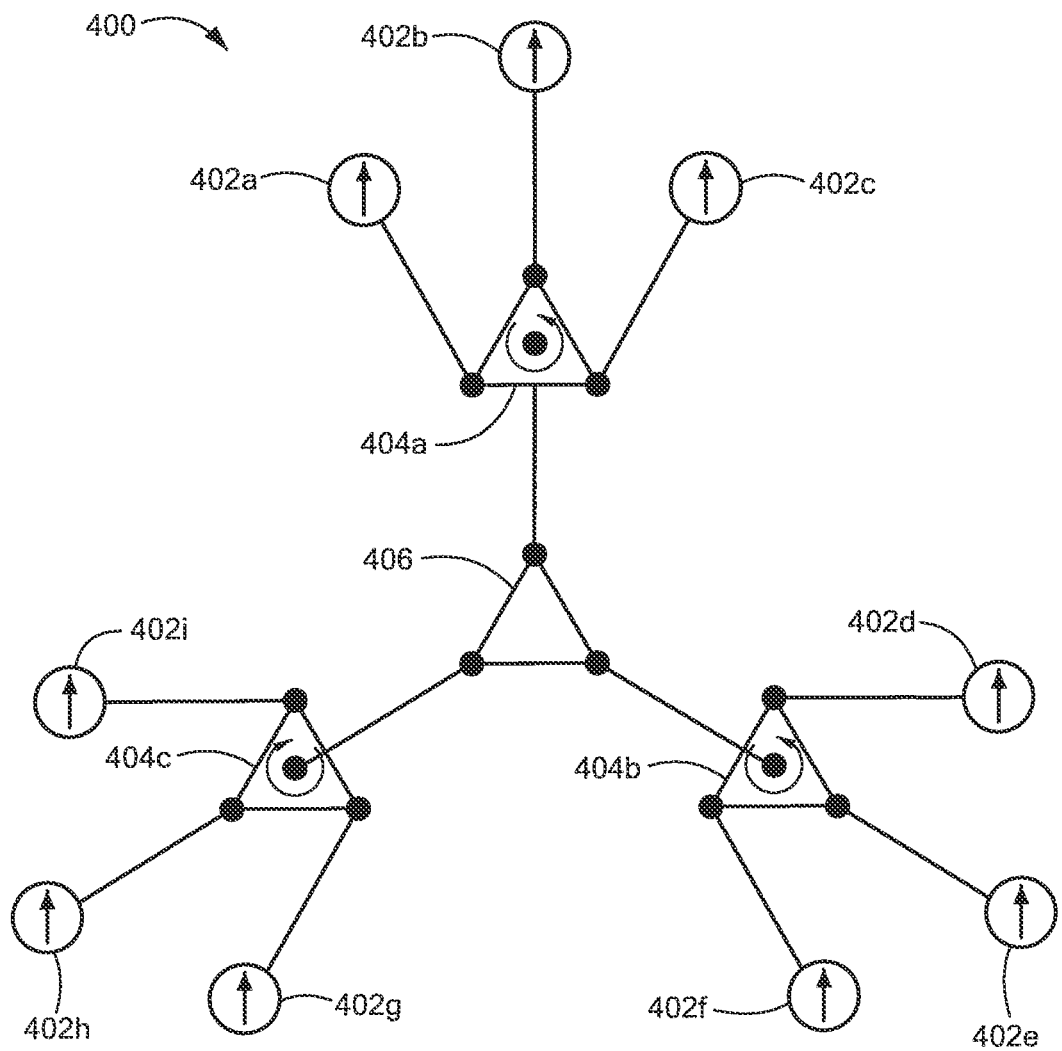
FIG. 4 is a diagram of an inverse paramagnetic tree structure to provide multiqubit interactions among greater than four qubits.

FIG. 4 illustrates how the different modes of mSQUID operation can be combined using a so-called "inverse paramagnetic tree" structure to provide higher-order multiqubit interactions. An inverse paramagnetic tree structure 400 may include a root mSQUID 406, a plurality of intermediate mSQUIDs (e.g., intermediate mSQUIDs 404a) coupled thereto, and a plurality of qubits (e.g., qubit 402a) coupled to each of the intermediate mSQUIDs. In the embodiment of FIG. 4, the structure 400 includes three (3) intermediate mSQUIDs 404a-404c, each having a group of three (3) qubits (or "spins") 402 coupled thereto. In particular, qubits 402a-402c are coupled to a first intermediate mSQUID 404a, qubits 402d-402f are coupled to a second intermediate mSQUID 404b, and qubits 402g-402i are coupled to a third intermediate mSQUID 404c.

The root mSQUID 406 may be operated in a different mode than the intermediate mSQUIDs 404. For example, each group of M (e.g., M=3) qubits 402 may be coupled to a respective intermediate mSQUID 404 operating in current mode, such that the total circulating current in each intermediate mSQUID 404 is proportion to a M-qubit operator product, with M=3 in FIG. 4. In turn, each intermediate mSQUID 404 may be coupled to a root mSQUID 406 operating in energy mode, such that the total energy in the root mSQUID 406 is proportional to an N-qubit operator product, with N=9 in FIG. 4. Thus, it will be appreciated that the parities of multiple groups of M qubits 402 can be combined, resulting in an effective interaction between all N qubits.

It should be understood that the tree structure 400 shown in FIG. 4 is merely one example and that an inverse paramagnetic tree structure 400 could include additional levels (i.e., more than one level of intermediate mSQUIDs 404) and could have more than three (3) connections at each levels of the tree. Moreover, the number of connections at each level may vary in some embodiments. For example, the root mSQUID could be coupled to a certain number of intermediate mSQUIDs, each of which could be coupled to a different number of qubits. Further, the structure 400 can be used to realize either X or Z operators by connecting to either the Z or X loops of the qubits 402.

Figure 4A:
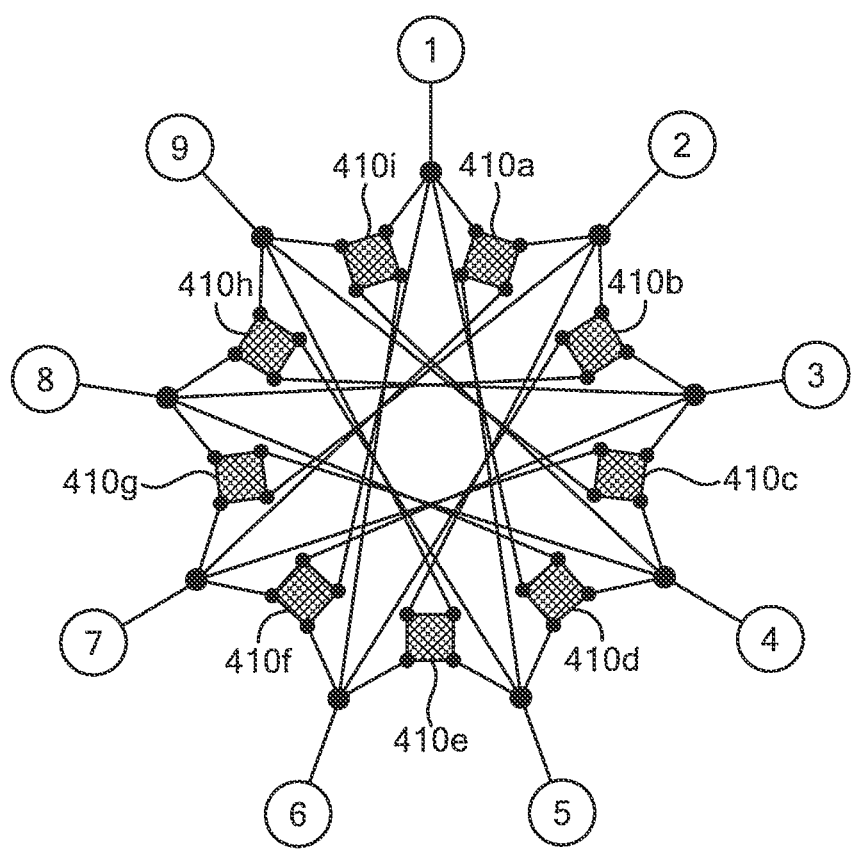
FIG. 4A is a diagram of a forward paramagnetic tree structure that uses four-spin couplers.

The four-spin coupler in FIGS. 2A-2C may be used in forward paramagnetic tree structures such as those disclosed in U.S. application Ser. No. 15/354,286, filed 2016 Nov. 17 and entitled "Paramagnetic Tree Coupling of Spin Qubits," which claims the benefit under 35 U.S.C. 119(e) of U.S. Provisional Application No. 62/256,200, filed 2015 Nov. 17 having the same title. The entire contents of these applications are incorporated herein by reference. One illustrative embodiment of such use is indicated in FIG. 4A, in which nine qubits are mutually coupled by a paramagnetic tree structure. FIG. 4A shows nine four-spin couplers 410a-410i (collectively for-spin couplers 410) having four, four-spin couplings per spin using three paramagnetic tree levels, with the four-spin couplers are at the third level. Thus, each spin qubit 1 through 9 participates in four separate four-spin couplings involving groups of three other qubits. For example, qubit #1 is connected via the tree to four four-spin couplers 410a, 410d, 410f, and 410i, and each of these are also connected to three other qubits by going back down the tree. For example, four-spin coupler 410a is coupled to qubits #1, #2, #5, and #7.

It is appreciated that the concepts, structures, and techniques described herein may be used to provide high-order qubit interactions and, as such, could have transformational importance in both quantum annealing and in digital quantum information processing.

All references cited herein are hereby incorporated herein by reference in their entirety.

Having described certain embodiments, which serve to illustrate various concepts, structures, and techniques sought to be protected herein, it will be apparent to those of ordinary skill in the art that other embodiments incorporating these concepts, structures, and techniques may be used. Elements of different embodiments described hereinabove may be combined to form other embodiments not specifically set forth above and, further, elements described in the context of a single embodiment may be provided separately or in any suitable sub-combination. Accordingly, it is submitted that the scope of protection sought herein should not be limited to the described embodiments but rather should be limited only by the spirit and scope of the following claims.

What is claimed is:

1. A circuit for coupling four flux qubits, the circuit comprising:
    a spin qubit, magnetically biased at substantially one half of the magnetic flux quantum; and
    a flux transformer, magnetically unbiased and inductively coupled to the spin qubit;
    wherein when the flux transformer is inductively coupled to the four flux qubits, a measurement of the energy of the system has one of two values depending on a total parity of the four flux qubits.

2. The circuit of claim 1, wherein the spin qubit comprises a radio frequency superconducting quantum interference device (RF SQUID).

3. The circuit of claim 1, wherein the flux transformer comprises:
    a first loop having a first Josephson junction; and
    a second loop having the first Josephson junction and a second Josephson junction, for tuning an energy response of the circuit.

4. The circuit of claim 1, further comprising four tuning couplers, each tuning coupler inductively coupled to the flux transformer and to a respective one of the four flux qubits.

5. The circuit of claim 4, wherein each tuning coupler is tuned to have a given magnetic interaction with the flux transformer.

6. The circuit of claim 1, further comprising a second spin qubit that is magnetically unbiased and inductively coupled to the flux transformer.

7. The circuit of claim 6, wherein the second spin qubit comprises an RF SQUID.

8. The circuit of claim 1, further comprising the four flux qubits inductively coupled to the flux transformer.

9. A method of measuring a spin parity of four flux qubits, the method comprising:
    coupling each of the four flux qubits to a flux transformer, the flux transformer being inductively coupled to a spin qubit that is magnetically biased at substantially one half of the magnetic flux quantum;
    operating the circuit in a current mode, wherein a current circulating within the spin qubit is proportional to a quantum parity operator; and
    measuring the spin parity by sensing a magnetic flux, of the spin qubit, that has one of two values.

10. The method of claim 9, wherein sensing a magnetic flux includes sensing a radio frequency superconducting quantum interference device (RF SQUID).

11. The method of claim 9, wherein coupling includes inductively coupling each of the four flux qubits to a respective tuning circuit and inductively coupling each such tuning circuit to the flux transformer.

12. The method of claim 11, further comprising tuning each tuning circuit to have a given magnetic interaction with the flux transformer.

13. The method of claim 12, wherein the given magnetic interaction produces a quartic response.

14. The method of claim 9, further comprising inductively coupling the flux transformer to a second spin qubit that is magnetically unbiased.

15. The method of claim 14, further comprising sensing a magnetic flux of the second spin qubit.

* * * * *